US006577254B2

(12) United States Patent
Rasmussen (10) Patent No.: US 6,577,254 B2
(45) Date of Patent: Jun. 10, 2003

(54) DATA COMPRESSION/DECOMPRESSION SYSTEM (75) Inventor: Brent D. Rasmussen, Meridian, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/992,970

(22) Filed: Nov. 14, 2001

(65) Prior Publication Data

US 2003/0090397 A1 May 15, 2003

(51) Int. Cl.[7] .................................. H03M 7/30
(52) U.S. Cl. .......................... 341/51; 341/87
(58) Field of Search ...................... 341/51, 87

(56) References Cited

U.S. PATENT DOCUMENTS

| 5,870,036 A | 2/1999 | Franaszek et al. ............. 341/51 |
| 5,970,221 A | 10/1999 | Bolash et al. ................. 305/115 |
| 6,008,743 A | 12/1999 | Jaquette ........................ 341/51 |
| 2001/0031092 A1 * | 10/2001 | Zeck et al. ................... 382/239 |
| 2002/0101367 A1 * | 8/2002 | Geiger et al. ................. 341/51 |

* cited by examiner

Primary Examiner—Howard L. Williams (57) ABSTRACT

An improved system and method for data compression/decompression are disclosed. A data compression system may comprise an input memory, a plurality of data compressors, and a controller. In preferred embodiments, the controller selectively forwards data compressed with the most efficient data compressor over sub-portions of a data stream. A data decompression system may be implemented with an input memory, a data compression method identifier, and a plurality of data decompressors. In preferred embodiments, the data compression method identifier selectively applies an appropriate data decompressor over sub-portions of a compressed data stream. A method for compressing data can be summarized by the following steps: receiving a data stream; applying a plurality of data compression algorithms to the data stream; determining which of the plurality of data compression algorithms was most effective; buffering the compressed data; and generating a record indicative of which the applied data compression algorithms. A method for decompressing data can be summarized as follows: receiving a compressed data stream; identifying which of a plurality of data decompression algorithms is appropriate to apply over a sub-portion of the compressed data stream; determining the length of the compressed sub-portion of the data stream; and applying the identified data decompression algorithm to the received compressed data stream for the length in bytes generated in the determining step.

31 Claims, 7 Drawing Sheets

DATA COMPRESSION/DECOMPRESSION SYSTEM

TECHNICAL FIELD

The present disclosure relates to systems and methods for processing digital data. More particularly, the invention relates to systems and methods that improve data transmission efficiency.

BACKGROUND OF THE INVENTION

Printer manufacturers, such as Hewlett-Packard, place great emphasis on cost minimization without sacrificing function or performance. Printers generally receive data to be printed in a high level language (HLL) or a page description language (PDL). The printers must receive this data, load any non-resident fonts identified by the print language, and convert the data stream into a recognizable data stream for the particular print engine. Conventional printers rely on various combinations of hardware, firmware, software, and internal memory to convert the received data stream into a printed product. The internal memory is often a random access memory (RAM) and read and write operations to the RAM often present a data processing bottleneck in the printing system.

The amount of RAM required in a particular printer design is directly related to the memory required to meet the needs of the height of the print line that the print engine can produce. For example, entry level laser printers may include a print engine capable of generating a ¾" high strip of printed information. In order to generate a printed page, the printing system may receive, translate, and buffer that amount of data required to generate a plurality of the ¾" high strips. Once a predetermined amount of information is available in a format understood by the laser mechanism, the printer may be configured to start the laser.

Conventional laser printing mechanisms cannot be stopped once the printing process has been initiated. Once the laser is started, the data processing system is in a race with the laser mechanism to continuously process the high level data sent by a host computing device into a format recognizable by the laser mechanism before the laser mechanism processes the buffered data. If the data processing system fails to remain ahead of the laser mechanism, the laser mechanism is generally programmed to abort the printing process. Consequently, printer manufacturers attempting to lower the per unit cost of their printers are interested in further exploiting data compression techniques in order to increase data processing efficiencies thereby reducing the amount of RAM required in the print system to maintain the laser mechanism. The resulting reduction in the amount of RAM required reduces the per unit cost of the associated printer.

With this and other continuous demands for improvements in data transmission efficiency and data storage capacities, improved data compression techniques are continually sought. Of the many classes of data compression, one of the most useful is the class of dictionary based compression techniques. Among these, the most useful today are the so-called Ziv-Lempel variable-length encoding procedures credited to J. Ziv and A. Lempel who suggested the "LZ1" length offset encoding scheme. The LZ1 process uses a sliding "history" window when processing past source data strings as the dictionary. Matches are encoded as a "match length" and an "offset" from an agreed position.

Because LZ1 scrolls the source string over a fixed sized sliding history window to create an adaptive dictionary, identification of duplicate "matching" strings in the source data is at first difficult, but becomes very efficient over time. Once a matching string is encoded as a "length" and "offset," the necessary decoding process is rapid and efficient, requiring no dictionary pre-load.

Sliding window data compression processes suffer from what may be called "start-up losses" and "non-redundancy losses" in compression efficiency. Because each source string or block begins with an empty "dictionary," the first source symbols must be transmitted as raw words without compression. Similarly, a string of input data which has already been encrypted or compressed and lacks substantial redundancy, lacks the matches required for compression and the source symbols must also be transmitted as raw words without compression.

Only after accumulating a substantial dictionary, by having the sliding window fill up with input data having substantial redundancy, are matches found for increasing numbers of sub-strings which allow encoding efficiency to increase to desired compression ratios.

In the original LZ1 arrangement, called, "LZ77," all source input is output in the form of a tripartite token having the length and offset together with a flag, which is the first character of the compressed sub-string. Techniques known as adaptive data compression (ALDC) overcome the problem when a non-redundant character is encountered by not sending the three part token, but instead providing the character unchanged, and providing it with a designation to indicate that it is not compressed. The unchanged raw character together with the designation is called a "literal." A typical designation is an added "zero" bit for each word of the source string. Thus, when encountering a string of non-redundant input data, the compression is expanded by a much smaller length than is likely with the original LZ1 technique. However, LZ1 techniques such as ALDC still must actually expand the data by one bit for every word, typically a 9/8 expansion to output them as literals.

Because of this problem, alternative dictionary based compression techniques have been designed to offer special advantages in particular circumstances. An example is LZ2 compression (also known as LZ78 or the related version known as LZW) which captures redundancies and maintains them in a dictionary, as described in "The Data Compression Book," M. Nelson, M & T Publishing, 1991, pp. 277–311, the contents of which are hereby incorporated by reference. Thus, the opportunity for having redundancies is expanded, at the cost of an expanded dictionary buffer. In LZ2, the expansion for literals may be more than one bit.

In addition to the aforementioned LZ compression techniques, a host of other known data compression techniques are known. For example, delta row encoders monitor changes in a bitmap used to describe a subsequent row or string of data from a bitmap used to describe a previous row. Under certain conditions, (e.g., slowly changing data from row to row) a delta row compression scheme may be particularly efficient. Other known data compression techniques such as Huffman and run length encoding may be well suited to other data conditions.

U.S. Pat. No. 6,008,743 describes a method and apparatus for switching between data compression modes by comparing the data compression efficiencies of the compression modes. The '743 Patent uses a multi-bit mode switch character to controllably select a particular data compression mode. Significantly, the switching technique described in the '743 Patent enables a data compression mode switch only upon an occurrence of an accumulated comparison measure reaching a threshold value.

Stated another way, a straight comparison is not used in formulating the switching decision. Rather, switching between modes takes into account the potential cost of the swap (in terms of the length of the added special character indicating the switch). More specifically, the apparatus disclosed in the '743 Patent does not switch between data compression modes until the savings (in terms of the length of the data saved) in making the switch is likely to meet a threshold which is directly related to the cost of the switch. Thus, the modes for compressing the input data are switched only upon the comparison indicating the compression efficiency of a proposed mode is less than the compression efficiency of the present mode by the threshold value.

U.S. Pat. No. 5,870,036 describes a method and apparatus for compressing data using a plurality of data compression mechanisms. Representative samples of each block of data are tested to select an appropriate one of a plurality of data compression mechanisms to apply to the block. The block is then compressed using the selected mechanism and the compressed block is provided with an identifier of the selected mechanism. In accordance with the teachings of the '036 Patent and similar to the teachings of the '743 Patent, if the best sample compression does not satisfy a threshold condition (e.g., 30% compression), then it is decided not to compress the data.

In an associated system for decompressing data, the coding identifier of the selected compression mechanism is examined, identified, and used to select an appropriate one of the plurality of decompression mechanisms to apply to the block. Multi-bit control codes and compression system identifiers provided in the output data as described above to indicate a special situation in data handling techniques, such as switching between compression modes, degrade the efficiency of the compression by the length of the character. From the above, it will be appreciated that it is desirable to provide further advances in data compression/decompression systems.

SUMMARY OF THE INVENTION

In response to these and other shortcomings of the prior art, the present invention relates to systems and methods for a data compression/decompression data processing system. Briefly described, in architecture, a data compressing system can be implemented with an input memory device configured to receive a data stream; a plurality of data compressors coupled to an output of the input memory, each of the plurality of data compressors configured to apply a data compression algorithm to the data stream to generate a respective compressed version of the data stream; and a controller coupled with each of the plurality of data compressors. In preferred embodiments, the controller is configured to determine which of the plurality of data compressors is most efficient over a select portion of the data stream, to create a record of the selected data compression algorithm, and to forward the data.

A related data decompressor may be implemented with an input memory device configured to receive a compressed data stream; a controller coupled to an output of the input memory, the controller configured to generate a control signal responsive to the data compression algorithm used to compress the data stream; and a plurality of controllably selectable data decompressors coupled to an output of the input memory, wherein a particular data decompressor is selectively coupled to the input memory in response to the control signal.

Some embodiments of the data compression/decompression system can also be viewed as providing methods for reducing memory requirements in a communication system. In this regard, a method for compressing data may include the following steps: a) receiving a data stream; b) applying a plurality of data compression algorithms to the data stream; c) determining which of the plurality of data compression algorithms was most effective; d) buffering the compressed data; and e) generating a record indicative of the applied data compression algorithm. Conversely, a method for decompressing data may include: a) receiving a compressed data stream; b) identifying which of a plurality of data decompression algorithms is appropriate to apply over a sub-portion of the data stream; c) determining the length of the compressed sub-portion of the data stream; and d) applying the identified data decompression algorithm to the received compressed data stream for the length in bytes generated in the determining step.

Other systems, methods, and features of the present invention will become apparent to one with skill in the art upon examination of the following drawings and detailed description. It is intended that all such additional systems, methods, and features included within this description, are within the scope of the present invention, and protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims.

In this regard, the drawings described below realize the data compression/decompression system in a printer system. Those skilled in the art of data processing will recognize and appreciate that the systems and methods described below are applicable to a wide range of data processing systems where a reduction in bandwidth of the data transferred is desired. The systems and methods described below may also be applied where a reduction in data storage capacity is desired.

Figure 1:
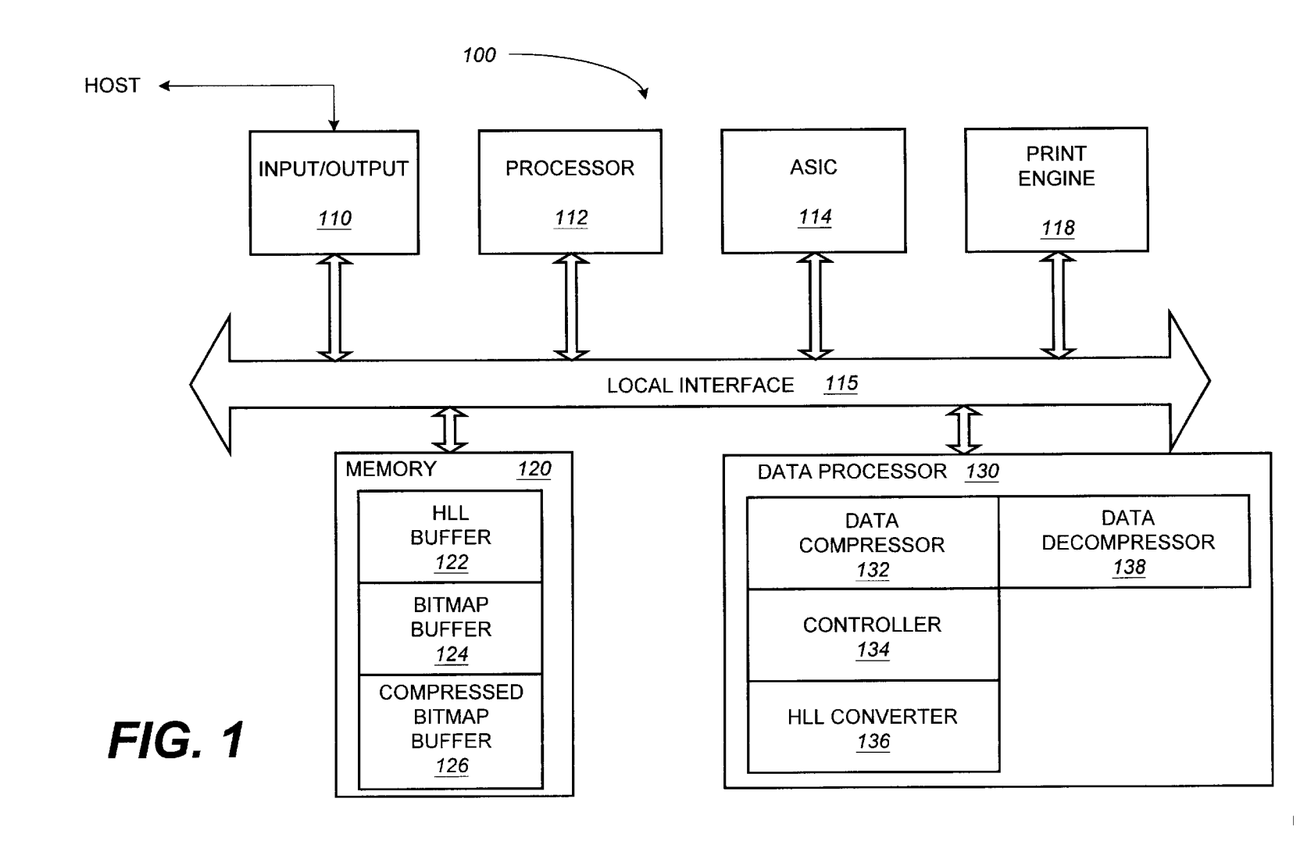
FIG. 1 is a functional block diagram illustrating an exemplar printing system that may employ the improved compression/decompression system.

Turning now to the drawings, wherein like referenced numerals designate corresponding parts throughout the drawings, reference is made to FIG. 1, which presents a functional block diagram illustrating a system that may employ the improved compression/decompression systems and methods.

In this regard, FIG. 1 illustrates the various functional blocks of a printer system. Printer system 100 includes an input/output port 110, a processor 120, an application specific integrated circuit (ASIC) 114, print engine 118, memory 120, and a data processor 130, all connected by a local interface 115. The input/output port 110 receives and transmits data from a host-computing device that is intended for processing by the printer system 100. Processor 120 may be a commercially available processor. The ASIC 114 may be configured with logic circuits that control, for example, the input/output port 110 and provide signals to drive printer motors. The print engine 118 includes all the mechanisms necessary to print text, images, and other information on a page. The print engine 118 may include mechanisms associated with a number of printer types. As previously stated above, the data compression/decompression system is not limited to any particular printer type or to any particular printer system 100.

The local interface 115 can be, for example but not limited to, one or more buses or other wired or wireless connections, as is known in the art. The local interface 115 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 112 is a hardware device for executing software, particularly that stored in memory 120 and/or in data processor 130. The processor 112 can be any custom made or commercially available processor, a central processing unit (CPU), a semiconductor based microprocessor (in the form of a microchip or chip set), a macroprocessor, or generally any device for executing software instructions.

The memory 120 can include any one or combination of volatile memory elements (e.g., random access memory (RAM, such as DRAM, SRAM, SDRAM, etc.)). The data processor 130, on the other hand, may include nonvolatile memory elements (e.g., ROM, EPROM, EEPROM, etc.). Note that the memory 120 can have a distributed architecture, where various components are situated remote from one another, but where each of the various elements can be accessed by the processor 112. Similarly, the data processor 130 can have a distributed architecture, with various components situated remote from one another, but where each of the various functional elements has access to the memory 120 via local interface 115. It should be appreciated that the various components of the data processor 130 illustrated in the functional block diagram of FIG. 1 may be distributed amongst the processor 112, ASIC 114, and the print engine 118 as may be desired.

For the purposes of the present disclosure, a swath is the print produced by a print mechanism in a single pass across the print medium. A print element are the smallest individual units (e.g., dots) used to generate a character or an image on the print medium. A raster is a horizontal single print element line that extends over the entire width of the swath. When the required number of rasters for the print head does not fit in the HLL buffer 122, the printer system 100 stops receiving data from the host either when the HLL buffer 122 is full or a swath has been received. A swath has been received when the number of rasters received equals the total number of vertical elements (e.g., nozzles when the printer is an inkjet printer) in the print head.

Printer system 100 receives data in the form of a HLL from a host-computing device via input/output port 110. The HLL may take several different forms. For example, the HLL may be a raster graphics language such as PCL® (PCL is a registered trademark of the Hewlett-Packard Company of Palo Alto, Calif.) or a PDL such as PostScript® (PostScript is the registered trademark of the Adobe Systems, Inc. of Mountain View, Calif.)

In an exemplar embodiment, memory 120 may be a random access memory (RAM) and may include a high level language (HLL) buffer 122, a bitmap buffer 124, and a compressed bitmap buffer 126. Conversely, the data processor 130 may be a read only memory (ROM) and may include a data compressor 132, a controller 134, a HLL converter 136, and a data decompressor 138. In alternative embodiment, the data processor 130 is implemented via a hardware solution either via its own separate and distinct ASIC, via one or more field programmable gate arrays, or a host of logic circuits configured to perform the various data compression algorithms, control functions, bitmapping, and data decompression algorithms as may be required to generate a hard copy rendition of one or may pages in a printer system 100.

Printer system 100 forwards the HLL data received from the host-computing device to the HLL buffer 122. Printer system 100 may continue to receive HLL data from the host-computing device while monitoring the usage of the HLL buffer 122. When the data required for the print engine to produce output across a swath of the page is received or the HLL buffer 122 becomes full, printer system 100 may be programmed to stop receiving data from the host-computing device and the HLL converter 136 may begin parsing the data and converting the data to a bitmap data format.

In this regard, the HLL converter 136 may be any system available that reads or receives HLL data and translates the data to bitmap data that a print head may use to print the underlying intended information. The HLL converter 136 may be configured to locate various information intended for a particular location on a printed page. The HLL converter 136 may generate one or more intermediate tables containing location coordinates as well as characters, fonts, lines, or other print features designated for application at a particular location on a page. These intermediate tables may themselves be compressed and decompressed as desired to reduce the amount of memory 120 required at any one time. As the HLL converter 136 is generating the bitmap data, the HLL converter 136 may interpret intermediate tables to determine which characters, lines, or other print features may intersect a particular swath of the page.

Conversion may be performed one raster at a time or after receiving a set amount of HLL data. The bitmap data may then be stored in the bitmap buffer 124. When the current swath has been converted and stored or when the bitmap buffer 124 is full, the data compressor 132 processes the bitmap data and stores the compressed data in the compressed bitmap buffer 126. This provides a mechanism for the data compressor 132 to use memory in the bitmap buffer 124 that previously contained bitmapped data. In other words, the controller 134 permits the data compressor 132 to overwrite portions of the bitmap buffer 124.

Once the compressed bitmap buffer 126 is full, the controller 134 may forward the compressed bitmap data to the print engine 118 that works together with the data decompressor 138 to uncompress the bitmapped data and sends it to the print head in order to generate the printed page.

Those skilled in the art should appreciate that data compression/data decompression operations may be occurring on a host of distinct levels within the printer system 100 at any given time. For example, HLL data may indicate that a specific font is required in order to replicate a particular line of text on a printed page. The printer system 100 may have previously stored and compressed a copy of the desired font in a portion of memory 120. Upon recognizing that the specific font has been requested, the printer system 100 may initiate a data decompression of the compressed font. Once the font has been decompressed and imbedded in the proper location within the data stream designated for the print engine 118, the printer system 100 may be configured to recompress and restore the font in memory 120.

Figure 2:
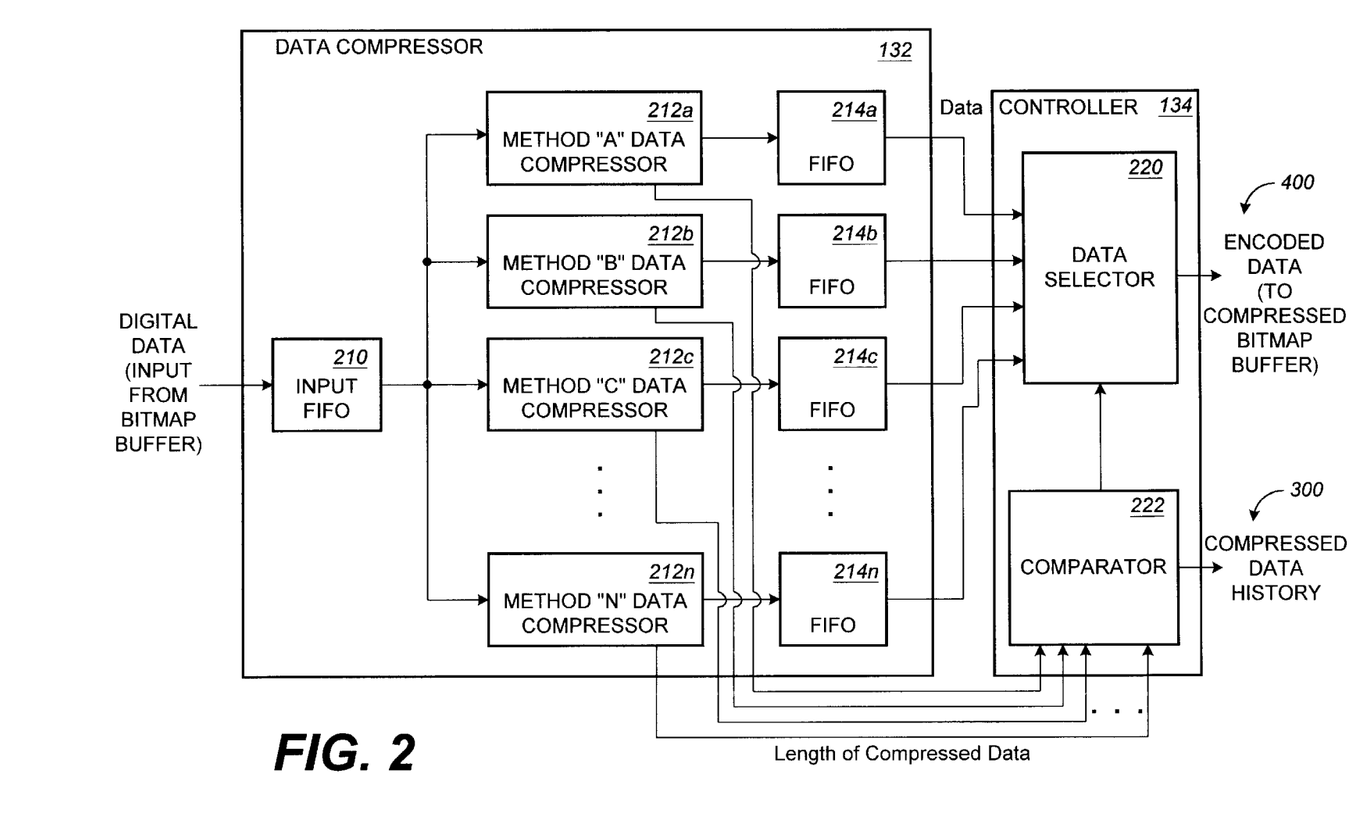
FIG. 2 is a functional block diagram illustrating a data compressor and controller of the improved compression/decompression system of FIG. 1.

Reference is now directed to FIG. 2, which illustrates the transformation of digital data from the bitmap buffer 124 into an encoded data stream 400 and a compressed data history 300 by the data compressor 132 and the controller 134. In this regard, the data compressor 132 may receive the digital data from the bitmap buffer 124 and forward the data to each of N data compressors 212a, 212b, 212c. . . 212n. Each of the N data compressors 212a, 212b, 212c, . . . , 212n, will compress the received bitmapped data in accordance with a known data compression technique. Each of the respective N data compressors 212a, 212b, 212c, . . . , 212n, may then forward its compressed version of the bitmapped data to a respective FIFO 214a, 214b, 214c, . . . , 214n. The FIFOs 214a, 214b, 214c, . . . , 214n buffer the various compressed versions before forwarding the various compressed data streams to the data selector 220.

In accordance with the exemplar configuration illustrated in FIG. 2, each of the respective N data compressors 212a, 212b, 212c, . . . , 212n forwards a signal indicative of the compressed length of a standard received length of the bitmapped data to a comparator 222. The comparator 222 determines which of the N data compressors has most efficiently compressed the bitmap data and forwards a signal indicative of the most efficient compression method to the data selector 220. The data selector 220 in turn generates an encoded data stream 400 that may be forwarded to the compressed bitmap buffer 126 (FIG. 1). As also shown in FIG. 2, the comparator 222 generates a compressed data history 300 responsive to the various data compressors selected for forwarding to the compressed bitmap buffer 126.

While the preferred embodiment of the data compression/decompression system applies the data compression selection operation after a fixed length interval of received HLL data has been compressed, it should be appreciated that the system may be configured to vary the fixed length interval in order to take advantage of data length efficiencies across the various data compression algorithms implemented in the system. Stated another way, depending on the types of data compression algorithms selected for the system, there may be an identifiable interval of HLL data that is more highly compressed over time than other fixed length intervals.

For example, it is known that dictionary based compression algorithms become more efficient with more data. If a set of dictionary based compression algorithms was continuously being asked to compress an insufficient length of HLL data so as to permit the separate dictionaries to build enough information to efficiently compress the data, the overall system performance would suffer. Conversely, if the same set of dictionary based data compressors was applied over a longer length of input data prior to selecting the optimum performer from the set of data compressors, the overall system performance may increase dramatically.

Figure 3:
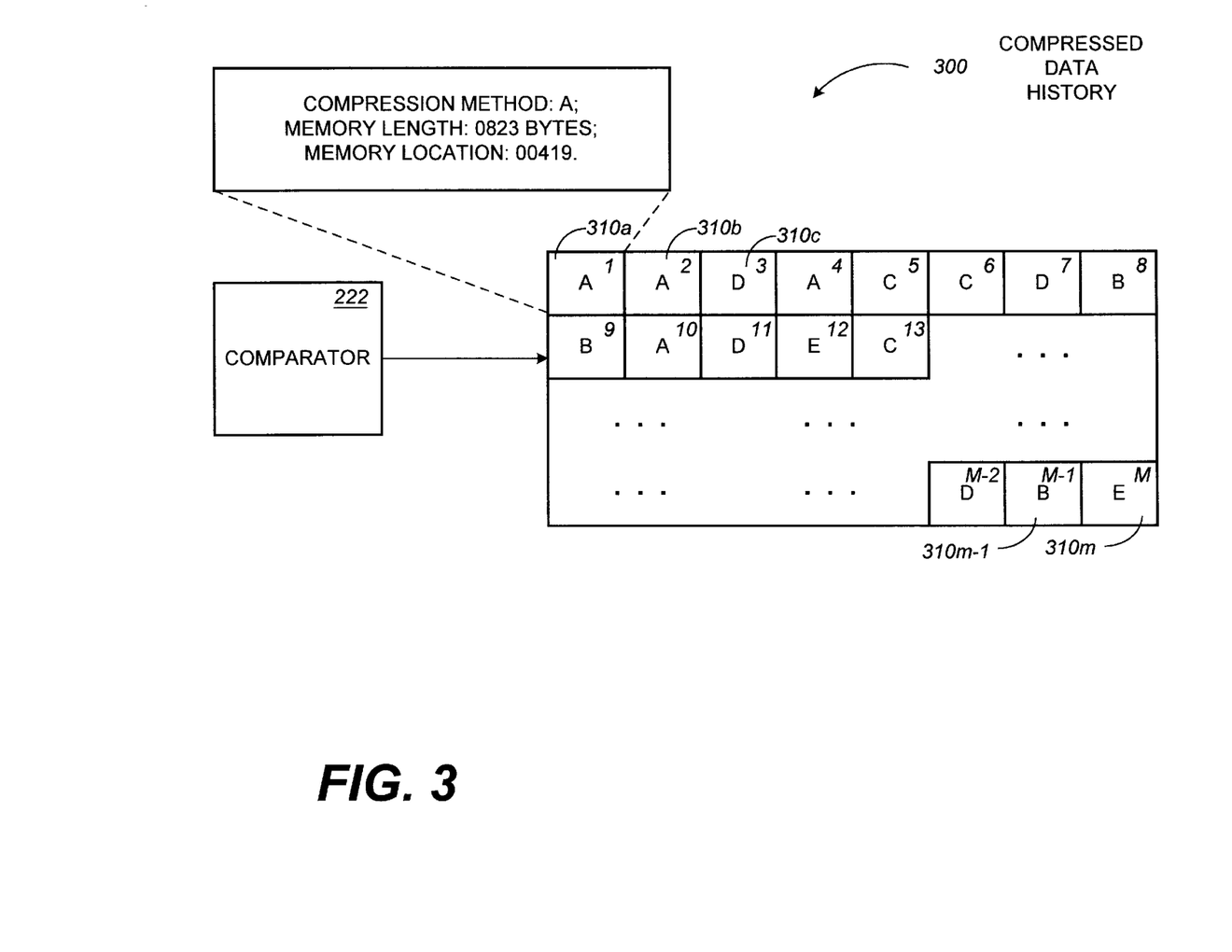
FIG. 3 is a schematic diagram further illustrating a compressed data history log that may be generated by the data compressor of FIG. 2.

FIG. 3 illustrates the composition of the compressed data history 300 generated by the comparator 222 of FIG. 2. In this regard, as shown in the schematic of FIG. 3, the compressed data history includes a stream of data compression method identifiers that can be used to identify the data compression method selected for each of M blocks of equal length (of input data). More specifically, in the particular exemplar embodiment illustrated in FIG. 3, the comparator 222 chose the following data compressors over the first thirteen standard lengths of HLL data: A, A, D, A, C, C, D, B, B, A, D, E, and C. As further illustrated in FIG. 3, the last three standard length HLL data blocks as selected by the comparator 222 were: D, B, E. As is also illustrated in the detail of the first standard length HLL data block, a compressed memory length and a memory location may also be stored for each HLL data block 310 in addition to the compression method selected.

The string of data compressors/methods identified in the compressed data history stream can be used by the print engine 118 and the data decompressor 138 (FIG. 1) to apply the appropriate data decompression scheme to each subsequent portion of the compressed bitmap to restore the original bitmapped data.

It will be further appreciated that each of the compressed data segments 310a, 310b, . . . , 310m-1, and 310m may include other indicators of the compressed data length. These other indicators may include a data compression ratio that may be included in the compressed data history 300 to enable the print engine 118 and the data decompressor 138 (FIG. 1) to remain synchronized with the HLL data forwarded to the print system 100. It is significant to note that the compressed data history control scheme described above will result in minimal overhead in the encoded data stream 400 generated by the combination of the data compressor 132 and controller 134.

In an embedded implementation, the compressed data history 300 as illustrated in FIG. 3, would be integrated into the compressed data itself. In one embodiment, each of the compressed data history segments 310i may be provided in a header inserted in the encoded data stream 400 (FIG. 2). In an alternative embodiment, the compressed data history 300 may be stored in a separate table within memory 120. In this implementation, the controller 134 may be configured to integrate the encoded data 400 with the compressed data history 300 in order to reproduce the original HLL data.

Figure 4:
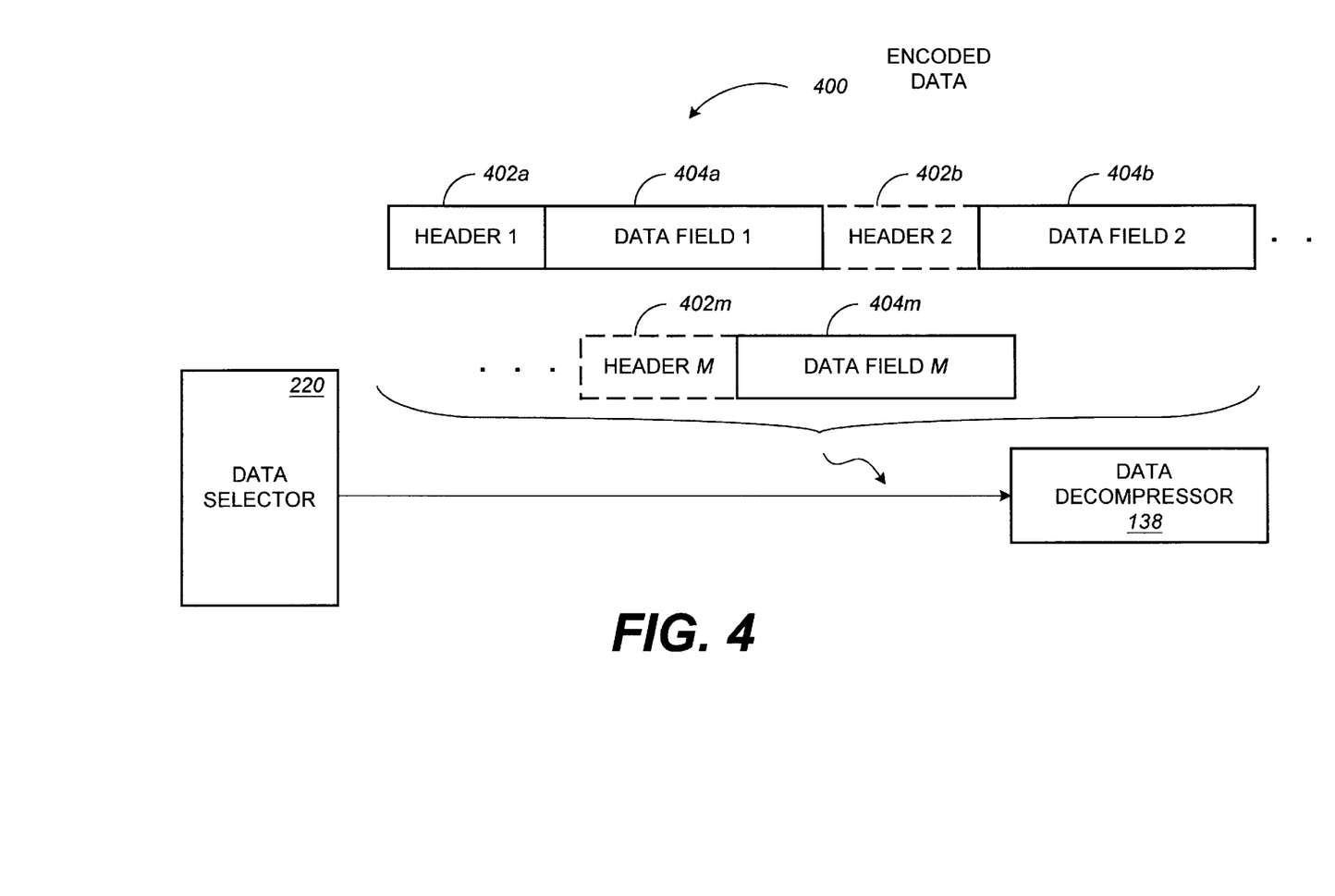
FIG. 4 is a schematic diagram further illustrating the encoded data generated by the data compressor of FIG. 2.

Reference is now directed to FIG. 4, which illustrates the encoded data 400. In this regard, the data selector 220 forwards the encoded data 400 to the data decompressor 138. As previously described, the data decompressor 138 may be configured to work together with the print engine 118 to convert the encoded data 400 into the bitmapped data required by the specific print head or other print mechanism used by the printer system 100. As illustrated in the schematic of FIG. 4, the encoded data 400 comprises a string of compressed data fields, with each data field 404 corresponding to a compressed representation of a standard bitmap data length.

As further illustrated in FIG. 4, the encoded data 400 may include a header 402. The header 402 may include information indicative of the start of a raster. Upon detecting the header 402, the controller 134 may be configured to reset the various elements of the data decompressor 138 in order to synchronize the decompression of the encoded data 400 with the HLL data input to the printer system 100.

In more robust alternative implementations, the comparator 222 (FIG. 2) may be configured to forward the compressed length of each standard length of the bitmap data to the data selector 220 for integration with the encoded data 400. In these more robust implementations, a separate header 402I may be inserted in the encoded data 400 and may be associated with an associated data field 404$i$. Those skilled in the art will appreciate the minimal overhead that such a header/data field scheme may add to the encoded data 400.

Figure 5:
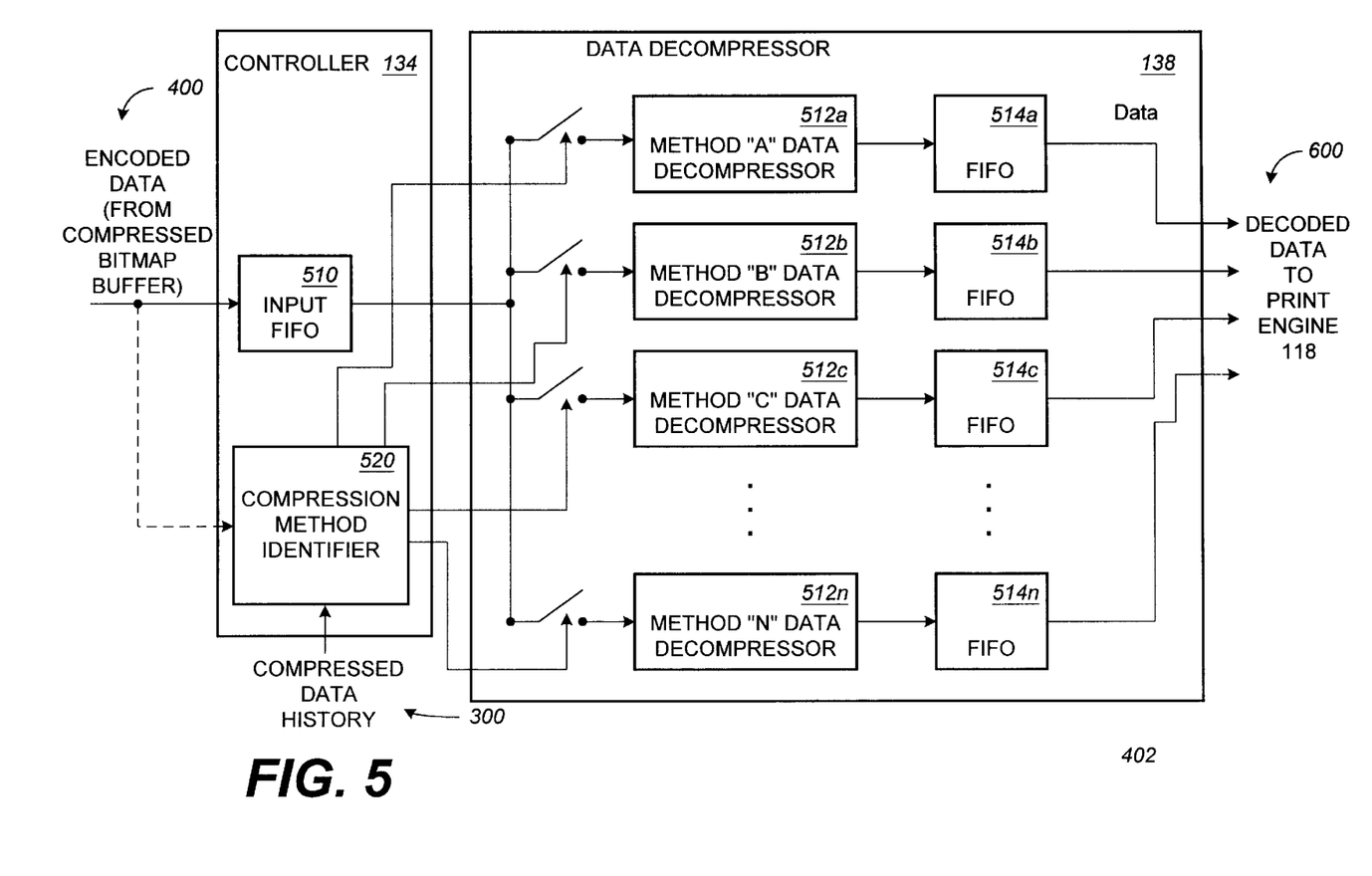
FIG. 5 is a functional block diagram illustrating the data decompressor and controller of FIG. 1.

Reference is now directed to FIG. 5, which illustrates the transformation of encoded digital data 400 from the compressed bitmap buffer 126 into a decoded data stream 600. In this regard, the controller 134 may include a compression method identifier 520 configured to receive the compressed data history 300. In response to the compressed data history 300, the compression method identifier 520 may generate a plurality of control signals to each of a plurality of switches 512$a$, 512$b$, 512$c$, . . . , 512$n$ configured to controllably enable/disable the application of the encoded data 400 to each of the N data decompressors 514$a$, 514$b$, 514$c$, . . . , 514$n$. In turn, the enabled data decompressor 514$i$ may receive and process the encoded digital data 400 from the compressed bitmap buffer 126 and may forward the decompressed data to an output FIFO 516$i$ which may forward the decoded data 600 to the print engine 118 (FIG. 1). Note that each of the N data decompressors 514$a$, 514$b$, 514$c$, . . . , 514$n$, will decompress the received compressed bitmapped data in accordance with the appropriate data decompression technique to generate the decoded data 600.

In accordance with the exemplar configuration illustrated in FIG. 5, the compression method identifier 520 responds to the compressed data history 300 to select and apply the correct data decompressor 514$i$. In an alternative configuration, where the encoded data 400 (FIG. 4) comprises a header 402$i$ that includes information responsive to the compressed length of the encoded data field 404$i$, the compression method identifier 520 may be configured to receive and process the compressed data from the compressed bitmap buffer 126 in order to identify and controllably select the appropriate data decompressor 514$i$.

Figure 6:
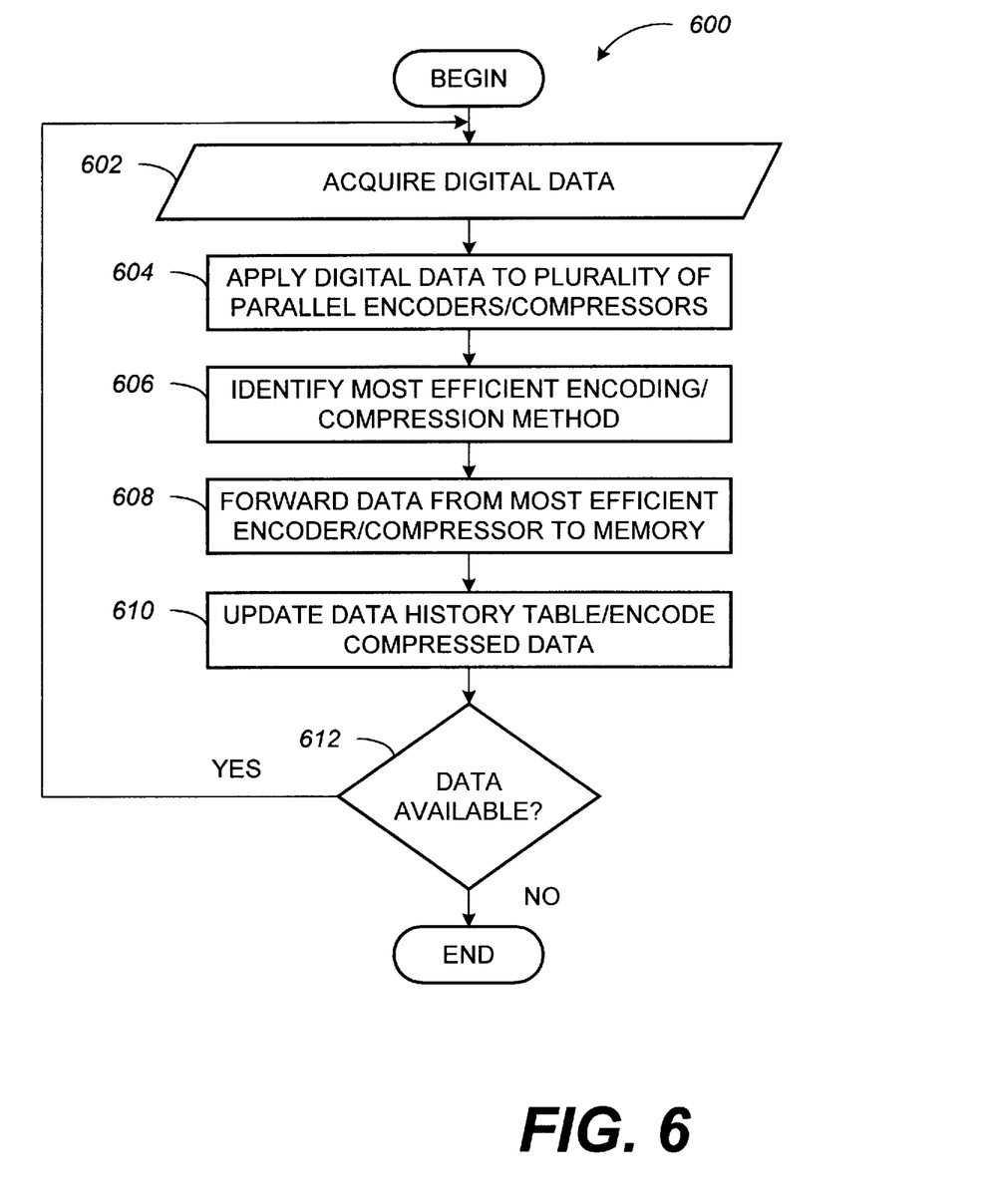
FIG. 6 is a flowchart illustrating a method for data compression that may be performed by the data compressor of FIG. 2.

The detailed description above, having introduced and described the various components of an exemplar data compression/decompression system in the form of a printer system 100, reference is now directed to FIG.6, which presents a flowchart illustrating a method for compressing data that may be performed by the data compressor of FIG. 2. In this regard, the printer system 100 may be configured to acquire or otherwise receive digital data as indicated in step 602. As shown in step 604, the printer system may be configured to apply the received digital data to a plurality of data compressors configured in parallel to one another. The plurality of data compressors may include hardware and or software/firmware implementations of industry known data compression algorithms, such as but not limited to, LZW, mode "M," run length encoding, delta row encoding, tagged image file format, ALDC, Huffman, etc.

While the list of exemplar data compression schemes listed immediately above includes lossless data compression/decompression schemes, the improved data compression/decompression system described herein is not limited to only lossless data compression/decompression algorithms. For example, a Joint Photographic Experts Group or JPEG data compressor, as well as other lossy compression algorithms may be implemented in the data compression/decompression system in order to reduce the memory requirements associated with reproducing a two-dimensional color image on a print medium.

Next, as shown in step 606, the printer system 100 or other suitably configured data processing system, may be configured to identify the most efficient data compression technique over an identified length of input data. As illustrated in step 608, the compressed data associated with the most efficient data compression scheme as identified in step 606 is forwarded to a memory device. As indicated in step 610, a data history table is updated with an indicator reflective of the particular data compression scheme selected in step 608 above.

As further illustrated in step 612, the printer system 100 may be configured to perform a query to determine if there is more data to be compressed arriving at the input to the printer system 100. As illustrated by the flow control arrow exiting the query of step 612, steps 602 through 610 may be repeated as required to compress data arriving at the input to the printer system 100. Otherwise, as illustrated by the "No" flow control branch exiting the query of step 612 the method for compressing data may terminate when it is determined that no data is being received in the printer system 100.

Figure 7:
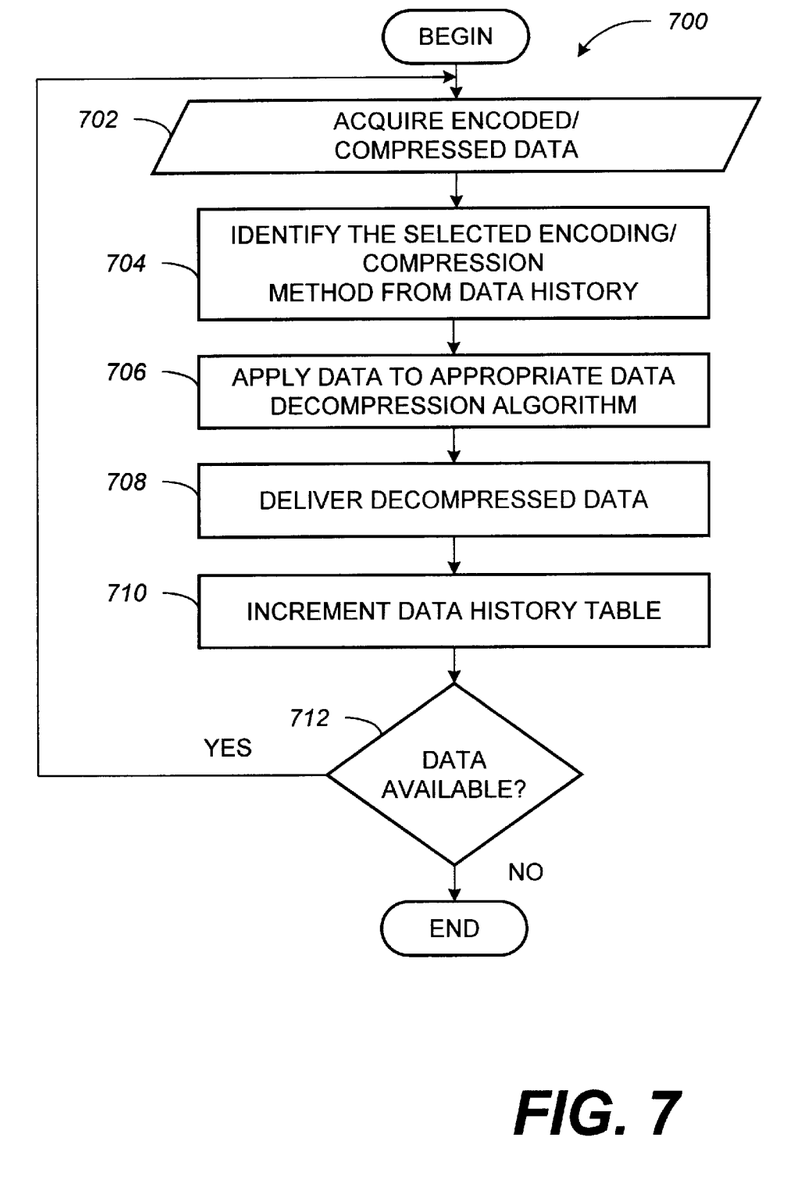
FIG. 7 is a flowchart illustrating a method for data decompression that may be performed by the data decompressor of FIG. 5.

Reference is now directed to the flowchart presented in FIG. 7, which illustrates a method for decompressing data 700 that may be performed by the data decompressor of FIG. 5. In this regard, the printer system 100 may be configured to acquire or otherwise receive compressed digital data as indicated in step 702. As shown in step 704, the printer system 100 may be configured to apply the received digital data to an appropriate data decompressor. In a preferred embodiment, the printing system 100 may be configured to process the compressed data through only the appropriate data decompressor as may be identified via the compressed data itself or via a data compression history table generated during the data compression process (i.e., during the process detailed in the flowchart of FIG. 6). In alternative embodiments, the data decompression system may be configured to process the compressed data through each available data decompressor 514$i$ (FIG. 5) with the data compression system configured to select the appropriate data decompression scheme at appropriate times during the data transfer as indicated by the compressed data 400 and/or the compressed data history 300. The plurality of data decompressors 514$i$ may include hardware and or software/firmware implementations of industry known data decompression algorithms, such as but not limited to, LZW, mode "M," run length encoding, delta row encoding, tagged image file format, ALDC, Huffman, etc.

Once the data decompression system has identified and decompressed the compressed data, the decompressed output data may be forwarded to the print engine 118 (FIG. 1) as illustrated in step 708. Next, the print system 100 may be configured to increment the data history table as indicated in step 710. In this way, the data decompressor 138 (FIG. 5) may be prepared to apply the appropriate data decompression algorithm to subsequent portions of the compressed data stream.

As further illustrated in step 712, the printer system 100 may be configured to perform a query to determine if there is more data to be decompressed within the printer system 100. As illustrated by the flow control arrow exiting the query of step 712, steps 702 through 710 may be repeated as required to decompress data. Otherwise, as illustrated by the "No" flow control branch exiting the query of step 712 the method for decompressing data 700 may terminate when it is determined that no data is available at the input to the data decompressor 138 (FIG. 5).

Any process descriptions or blocks in the flow charts of FIGS. 6 and 7, should be understood as representing modules, segments, or portions of code which include one or more executable instructions for implementing specific logical functions or steps in the associated process. Alternate implementations are included within the scope of the present invention in which functions may be executed out of order from that shown or discussed, including substantially concurrently or in reverse order, depending on the functionality involved, as would be understood by those reasonably skilled in the art of the present data compression/decompression system.

While the printer system 100 of FIG. 1 includes a data processor 130 that may include both a data compressor 132 and a data decompressor 138 that may be implemented in one or more hardware based configurations, it will be appreciated that the printer system 100 in accordance with the teachings and concepts of the data compression and decompression system may be implemented in software operable on a computing device, such as but not limited to, a special or general-purpose digital computer, such as a personal computer (PC; IBM-compatible, Apple-compatible, or otherwise), workstation, minicomputer, or mainframe computer.

When the data compression/decompression system is implemented in software, it should be noted that the processing steps previously described in association with the flowcharts of FIGS. 6 and 7 can be stored on any computer readable medium for use by or in connection with any computer related system or method.

In the context of this document, a computer readable medium is an electronic, magnetic, optical, or other physical device or means that can contain or store a computer program for use by or in connection with a computer related system or method. Thus, the data compression/decompression system can be embodied in any computer-readable medium for use by or in connection with an instruction execution system, apparatus, or device, such as a computer-based system, processor-containing system, or other system that can fetch and execute the instructions.

The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention as protected and set forth by the following claims.

Having thus described the invention, what is claimed is the following:

1. A data processing system, comprising:
an input memory configured to receive a data stream;
a plurality of data compressors communicatively coupled with the input memory, each of the plurality of data compressors configured to apply a data compression algorithm to the data stream to generate a respective compressed version of the data stream; and
a controller communicatively coupled with each of the plurality of data compressors, the controller configured to:
determine which of the plurality of data compressors generated the smallest compressed version of the data stream;
sub-divide the data stream into a plurality of intervals each having a fixed length;
increase the length of each of the fixed intervals in response to improving data compression efficiency with a corresponding increase in the length of each of the fixed intervals; and
forward the smallest compressed version of the data stream.

2. The system of claim 1, wherein the controller is further configured to insert a header associated with each of the plurality of intervals, the header identifying the data compression scheme used to generate the smallest compressed version of the data stream.

3. The system of claim 1, wherein the controller is further configured to generate a table comprising information responsive to the particular one of the plurality of data compressors that generated the smallest compressed version of the data stream.

4. The system of claim 3, wherein the table comprises a memory location for each of the intervals of the compressed data stream.

5. The system of claim 3, wherein the table comprises a data length for each of the intervals of the compressed data stream.

6. The system of claim 1, wherein the data stream comprises information responsive to a memory location associated with each of the intervals of the data stream.

7. The system of claim 1, wherein the data stream comprises information responsive to a memory length associated with each of the intervals of the data stream.

8. A method for compressing data, comprising:
receiving a data stream;
sub-dividing the data stream into a plurality of intervals each having a fixed length;
applying the plurality of intervals to a plurality of data compression algorithms;
determining which of the plurality of data compression algorithms was most effective over a sub-portion of the data stream; and
increasing the length of each of the intervals in response to improving data compression efficiency with a corresponding increase in the length of each of the fixed intervals.

9. The method of claim 8, further comprising generating a record indicative of which of the data compression algorithms was most effective.

10. The method of claim 9, wherein generating produces information responsive to a memory location associated with each of the plurality of intervals of the data stream.

11. The method of claim 9, wherein generating produces information responsive to a memory length associated with each of the plurality of intervals of the data stream.

12. A data processing system, comprising:
   an input memory configured to receive a compressed data stream, the compressed data stream comprising a plurality of intervals, the length of the intervals responsive to improving data compression efficiency over a corresponding increase in length of the intervals;
   a controller communicatively coupled with the input memory, the controller configured to apply information indicative of the data compression algorithm used to compress the data stream in order to generate a control signal; and
   a plurality of data decompressors each selectively coupled to an output of the input memory to receive the compressed data stream, wherein a particular data decompressor is coupled to the input memory in response to the control signal to generate a reproduction of a clear text version of the compressed data stream.

13. The system of claim 12, wherein the controller is configured to generate the control signal in response to a compressed data history.

14. The system of claim 12, wherein the controller is configured to generate the control signal in response to information imbedded within the compressed data stream.

15. The system of claim 12, wherein the controller is configured to generate the control signal in response to information identifying a plurality of intervals within the compressed data stream.

16. The system of claim 15, wherein the information identifying the plurality of intervals within the compressed data stream comprises a compressed data history.

17. A method for decompressing compressed data, comprising:
   receiving a compressed data stream, the compressed data stream comprising a plurality of intervals, the length of the intervals responsive to improving data compression efficiency over a corresponding increase in length of the intervals;
   identifying which of a plurality of data decompression algorithms is appropriate to apply over the plurality of intervals within the data stream;
   determining the length of the compressed intervals of the data stream; and
   applying the identified data decompression algorithm to the received compressed data stream for the length in bytes generated in the determining step.

18. The method of claim 17, wherein identifying is responsive to information imbedded within the compressed data stream.

19. The method of claim 17, wherein identifying is responsive to information in a compressed data history.

20. The method of claim 17, wherein determining extracts information responsive to the length of each of the plurality of intervals within the compressed data stream.

21. The method of claim 17, wherein determining extracts information responsive to the length of each the plurality of intervals within the compressed data stream from a compressed data history generated concurrently with the compressed data stream.

22. A computer program embodied on a computer-readable medium, the computer program, comprising:
   a first code segment that receives a data stream, the first code segment configured to forward the data stream to a plurality of data compression algorithms to generate a plurality of compressed representations of the data stream;
   a second code segment configured to receive and compare the compressed representations of the data stream, wherein the second code segment selectively forwards one of the plurality of compressed representations; and
   a third code segment configured to increase the length of each of a plurality of intervals used to generate the plurality of compressed representations in response to improving data compression efficiency with a corresponding increase in the length of each of the plurality of intervals.

23. The program of claim 22, wherein the second code segment is configured to forward the most compressed representation of the data stream.

24. The program of claim 22, wherein the second code segment is configured to forward information responsive to the particular data compression algorithm that generated the most compressed representation of the data stream.

25. The program of claim 24, wherein the information is forwarded to a data compression history table.

26. The program of claim 24, wherein the information is forwarded within the compressed representation of the data stream.

27. The program of claim 26, wherein the information is inserted in a header associated with each of a plurality of segments of the data stream.

28. A computer program embodied on a computer-readable medium, the computer program, comprising:
   a first code segment configured to receive a compressed data stream, the compressed data stream comprising a plurality of intervals, the length of the intervals responsive to improving data compression efficiency over a corresponding increase in length of the intervals, the first code segment configured to identify one of a plurality of data decompression algorithms wherein the identified data decompression algorithm is the corollary to a data compression algorithm used to compress an original version of the data stream; and
   a second code segment configured to apply the identified data decompression algorithm to reconstruct the original data stream.

29. The program of claim 28, wherein the first code segment is configured to identify the appropriate data decompression algorithm by retrieving information from a data compression history table.

30. The program of claim 28, wherein the first code segment is configured to identify the appropriate data decompression algorithm by extracting information forwarded within the compressed representation of the data stream.

31. The program of claim 30, wherein the information is extracted from a header associated with each of a plurality of compressed segments of the data stream.

* * * * *